US012615737B2

(12) United States Patent
Zborowski et al.

(10) Patent No.: US 12,615,737 B2
(45) Date of Patent: Apr. 28, 2026

(54) HEAT EXCHANGER

(71) Applicant: Aptiv Technologies AG, Schaffhausen (CH)

(72) Inventors: Jakub Zborowski, Cracow (PL); Grzegorz Puchala, Cracow (PL)

(73) Assignee: Aptiv Technologies AG, Schaffhausen (CH)

(*) Notice: Subject to any disclaimer, the term of this patent is extended or adjusted under 35 U.S.C. 154(b) by 640 days.

(21) Appl. No.: 18/154,929

(22) Filed: Jan. 16, 2023

(65) Prior Publication Data

US 2023/0269905 A1     Aug. 24, 2023

Related U.S. Application Data

(60) Provisional application No. 63/268,415, filed on Feb. 23, 2022.

(51) Int. Cl.
*H05K 7/20* (2006.01)

(52) U.S. Cl.
CPC ..... *H05K 7/20254* (2013.01); *H05K 7/20272* (2013.01); *H05K 7/20872* (2013.01)

(58) Field of Classification Search
CPC .......... H05K 7/20872; H05K 7/20254; H05K 7/20272; H05K 7/20327
See application file for complete search history.

(56) References Cited

U.S. PATENT DOCUMENTS

<table>
<tr><td>5,263,538 A</td><td></td><td>11/1993</td><td>Amidieu et al.</td><td></td></tr>
<tr><td>7,508,670 B1 *</td><td></td><td>3/2009</td><td>Thorson</td><td>............. H05K 7/20636<br>361/689</td></tr>
<tr><td>7,626,820 B1 *</td><td></td><td>12/2009</td><td>Konshak</td><td>............ H05K 7/20672<br>165/80.4</td></tr>
<tr><td>10,314,207 B1</td><td></td><td>6/2019</td><td>Skalski et al.</td><td></td></tr>
<tr><td>10,383,261 B2 *</td><td></td><td>8/2019</td><td>Krivonak</td><td>........... H05K 7/20927</td></tr>
<tr><td>2009/0152216 A1 *</td><td></td><td>6/2009</td><td>Champion</td><td>................ G06F 1/20<br>211/26</td></tr>
<tr><td>2011/0267776 A1 *</td><td></td><td>11/2011</td><td>Porreca</td><td>................ H05K 7/1404<br>361/720</td></tr>
<tr><td>2016/0282054 A1 *</td><td></td><td>9/2016</td><td>Hirasawa</td><td>............ H01L 23/3736</td></tr>
<tr><td>2022/0033700 A1 *</td><td></td><td>2/2022</td><td>Kodama</td><td>............ H05K 7/20872</td></tr>
<tr><td>2022/0418170 A1 *</td><td></td><td>12/2022</td><td>Duffy</td><td>................. H05K 7/20272</td></tr>
<tr><td>2023/0127378 A1 *</td><td></td><td>4/2023</td><td>Jovet</td><td>................... H01M 10/613<br>165/80.4</td></tr>
</table>

OTHER PUBLICATIONS

"European Search Report", EP Application No. 23153906, Jul. 26, 2023, 7 pages.

* cited by examiner

*Primary Examiner* — Jayprakash N Gandhi
*Assistant Examiner* — Matthew Sinclair Muir
(74) *Attorney, Agent, or Firm* — Harness, Dickey & Pierce, P.L.C.

(57) ABSTRACT

A heat exchanger is described herein. Specifically, the heat exchanger contains plates configured to pass a heat transfer fluid therethrough. The plates are interconnected via features that are integrated into the plates. The heat exchanger also contains frames that are connected to the plates and configured to guide electrical components along an insertion axis such that heat generating surfaces of the electrical components are in contact with the plates on insertion. The heat exchanger is thereby configured to allow for reliable heat dissipation for a plurality of electrical components within a small space while allowing the electrical components to be easily installed and serviced.

19 Claims, 8 Drawing Sheets

Form top and bottom plates

802

Form a plurality of frames

804

Attach the top and bottom plates to one another around a first of the frames

806

Dispose a second of the frames to the top and bottom plates opposite the first frame

808

Secure the top and bottom plates to the frames

810

HEAT EXCHANGER

CROSS-REFERENCE TO RELATED APPLICATION

This application claims the benefit of U.S. Provisional Patent Application No. 63/268,415, filed Feb. 23, 2022, which is incorporated by reference herein in its entirety.

BACKGROUND

Modern automobiles are being configured with increasing numbers of electronic components (e.g., electronic control units (ECUs), domain control units (DCUs)). Dissipation of heat generated by such components, while adhering to packaging constraints of the vehicles in which they are disposed, is difficult. The problem is often compounded when multiple components are positioned near each other. One conventional approach is to use heat exchangers (e.g., fluid heat exchangers) in contact with heat-generating surfaces of the components. For example, heat exchanger plates may be placed between or around a stack of components. One problem with such an approach is that once the stack is assembled, replacement or servicing of any of the components is very difficult, as the stack must be disassembled to gain access. Furthermore, the assemblies often require many parts, which increases cost and failure points.

SUMMARY

This document is directed to a heat exchanger and components thereof. The heat exchanger comprises a top plate and a bottom plate that is disposed parallel to the top plate and offset from the top plate along a stack axis. The heat exchanger further comprises a plurality of frames connected to respective ends of the top plate and the bottom plate. The frames comprise frame guides that are configured to guide one or more electrical components as they are inserted along an insertion axis, such that each of the electrical components are in contact with a respective surface of either the top plate or the bottom plate once inserted.

This Summary introduces simplified concepts for a heat exchanger that are further described in the Detailed Description and Drawings. This Summary is not intended to identify essential features of the claimed subject matter, nor is it intended for use in determining the scope of the claimed subject matter.

BRIEF DESCRIPTION OF THE DRAWINGS

A heat exchanger and components thereof are described with reference to the following drawings that use some of the same numbers throughout to reference like or examples of like features and components.

DETAILED DESCRIPTION

Electrical components are increasingly being implemented in automotive environments. Often times, the electrical components are disposed within close proximity of each other due to packaging constraints. Dissipating heat generated by such electrical components is often a challenge. While systems have been developed to place cooling plates between the electrical components, the systems often require a large number of parts which increases cost and potential points of failure. Furthermore, such systems do not allow for servicing of the electrical components once assembled/installed. For example, if a stack of electrical components and cooling plates is disposed in a vehicle, a technician may need to disassemble the entire stack to service a single component. Doing so may increase service complexity (and therefor cost) and/or may introduce potential opportunities for mistakes.

A heat exchanger is described herein. Specifically, the heat exchanger contains plates configured to pass a heat transfer fluid therethrough. The plates are interconnected via features that are integrated into the plates. The heat exchanger also contains frames that are connected to the plates and configured to guide electrical components along an insertion axis such that heat generating surfaces of the electrical components are in contact with the plates on insertion. The heat exchanger is thereby configured to allow for reliable heat dissipation for a plurality of electrical components within a small space while allowing the electrical components to be easily installed and serviced.

Figure 1A:
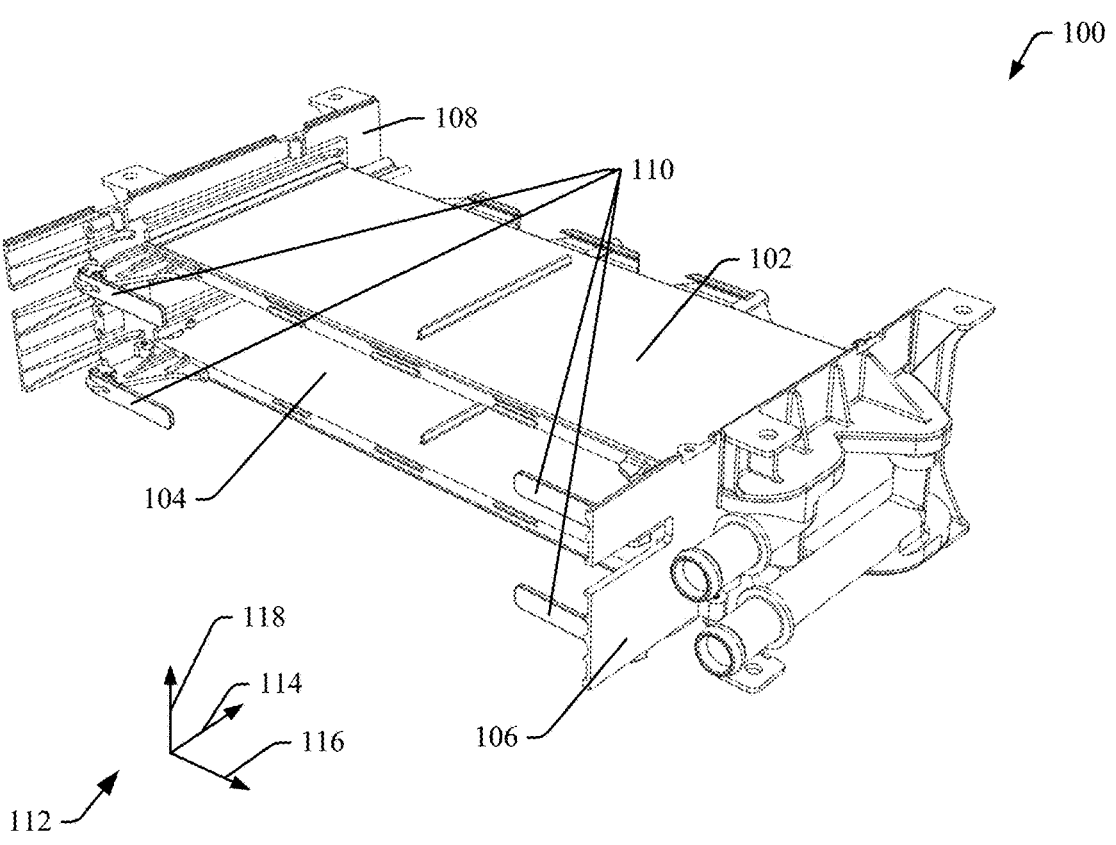
FIGS. 1A and 1B illustrate, in accordance with this disclosure, an example heat exchanger.
Figure 1B:
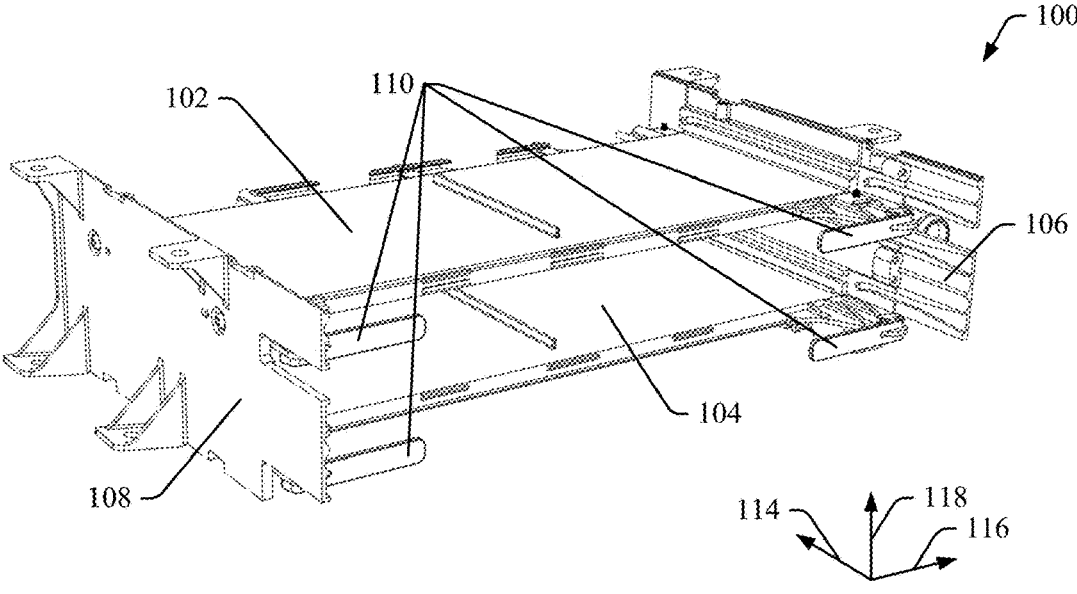

FIGS. 1A and 1B illustrate an example of a heat exchanger 100. Although described in terms of an automotive environment, the heat exchanger 100 may be used in a variety of other environments (e.g., motorcycles, e-bikes, boat, air vehicle, and so on). In general, the heat exchanger 100 is configured to withstand typical environmental conditions of such environments. For example, the heat exchanger 100 may be configured for large temperature ranges (e.g., −40-125 degrees Celsius), high vibration and shock loads, stress/fatigue scenarios, humidity/water exposure, dust/dirt exposure, etc.

The heat exchanger 100 includes a top plate 102, a bottom plate 104, a right frame 106, a left frame 108, and one or more locking mechanisms 110. For clarity, a coordinate system 112 is used herein. The coordinate system 112 includes an insertion axis 114, a horizontal axis 116, and a stack axis 118. The naming of components and the coordinate system 112 are not intended to be limiting. For example, top/bottom and right/left may be switched and other coordinate systems may be used without departing from the scope of this disclosure.

The insertion axis 114 is an axis along which electrical components (e.g., electrical assemblies, electro-mechanical assemblies, electrical boards, electrical components, electrical devices, electrical modules, batteries, battery modules, battery assemblies, computers, ECUs, DCUs, body control units (BCUs)) may be inserted into the heat exchanger 100. The positive insertion axis direction (e.g., direction of the arrow of the insertion axis 114) corresponds to an insertion direction of the electrical components.

The insertion axis 114 also provides a front/rear reference of the heat exchanger 100. For example, the positive insertion axis direction is towards a rear side of the heat exchanger 100 while the negative insertion axis direction (e.g., against the arrow of the insertion axis 114) is toward a front side of the heat exchanger 100.

The horizontal axis 116 is an axis that is perpendicular to the insertion axis 114 and gives a left/right orientation relative to the insertion axis 114 (e.g., for the right frame 106 and the left frame 108). For example, the positive horizontal axis direction (e.g., with the arrow of the horizontal axis 116) is towards a right side of the heat exchanger 100 while the negative horizontal axis direction (e.g., against the arrow of the horizontal axis 116) is toward a left side of the heat exchanger 100.

The stack axis 118 is an axis perpendicular to the insertion axis 114 and the horizontal axis 116. The stack axis 118 generally corresponds to an axis on which the electrical components are stacked on each other. For example, the electrical components may have planar heat generating surfaces that are aligned parallel to each other with generally overlapping areas. The top plate 102 and the bottom plate 104 are separated along the stack axis 118 by an offset. As illustrated, the heat exchanger 100 is configured to accept two electrical components between the top plate 102 and the bottom plate 104 and another electrical component above the top plate 102. A fourth electrical component may be secured to the underside of the bottom plate 104.

The stack axis 118 also provides a top/bottom reference to the heat exchanger 100. For example, the positive stack axis direction (following the arrow of the stack axis 118) is towards a top side of the heat exchanger 100 while the negative stack axis direction (against the arrow of the stack axis 118) is toward a bottom side of the heat exchanger 100.

The top plate 102 and the bottom plate 104 are connected to each other via respective manifolds and ports. For example, a top plate manifold may interface with a bottom plate port and a bottom plate manifold may interface with a top plate port. Further description of the top plate 102, the bottom plate 104, and components thereof are discussed further below.

The right frame 106 and the left frame 108 are connected to the top plate 102 and the bottom plate 104. The right frame 106 and the left frame 108 may be attached to the top plate 102 and the bottom plate 104 using any means known by those of ordinary skill the art. For example, the components may be screwed/bolted, use alignment pins, interference fits, adhesives, welding/brazing, or any combination thereof. The left frame 108 may be attached to left ends of the top plate 102 and the bottom plate 104 and the right frame 106 may be attached near right ends of the top plate 102 and the bottom plate but indented. The indentation may allow for plumbing connections to not interfere with insertion of the electrical components, support of connections between the top plate 102 and the bottom plate 104, and/or ease of manufacturing. However, in some implementations, the right frame 106 may be attached to right ends of the top plate 102 and the bottom plate 104.

The right frame 106 and the left frame 108 are configured to guide the electrical components as they are inserted along the insertion axis 114. The guiding ensures that, once inserted, a heat generating surface of each of the electrical components is in contact with a respective surface of the top plate 102 or the bottom plate 104. For example, a first electrical component may be guided such that its heat generating surface is in contact with a top surface of the top plate 102, a second electrical component may be guided such that its heat generating surface is in contact with a bottom surface of the top plate 102, and a third electrical component may be guided such that its heat generating surface is in contact with a top surface of the bottom plate 104.

The locking mechanisms 110 are configured to ensure a proper final location of the electrical components and also prevent them from backing out in the insertion direction once inserted. The locking mechanisms are discussed further below.

The heat exchanger 100 includes inlet and outlet connections (e.g., for heat transfer fluid influent and effluent) that are described further below. Although the connections to the heat exchanger are shown on the right side and facing the front (relative to the insertion direction), the connections may be disposed on any side of the heat exchanger 100 with connections facing in any direction (e.g., by reconfiguring the components) without departing from the scope of this disclosure.

Accordingly, the heat exchanger 100 is able to transfer heat from a plurality of electrical components while ensuring easy assembly and serviceability of the electrical components. Doing so may enable more compact packaging and decreased cost, not only at production, but also throughout the lives of the systems in which it is installed.

Figure 2A:
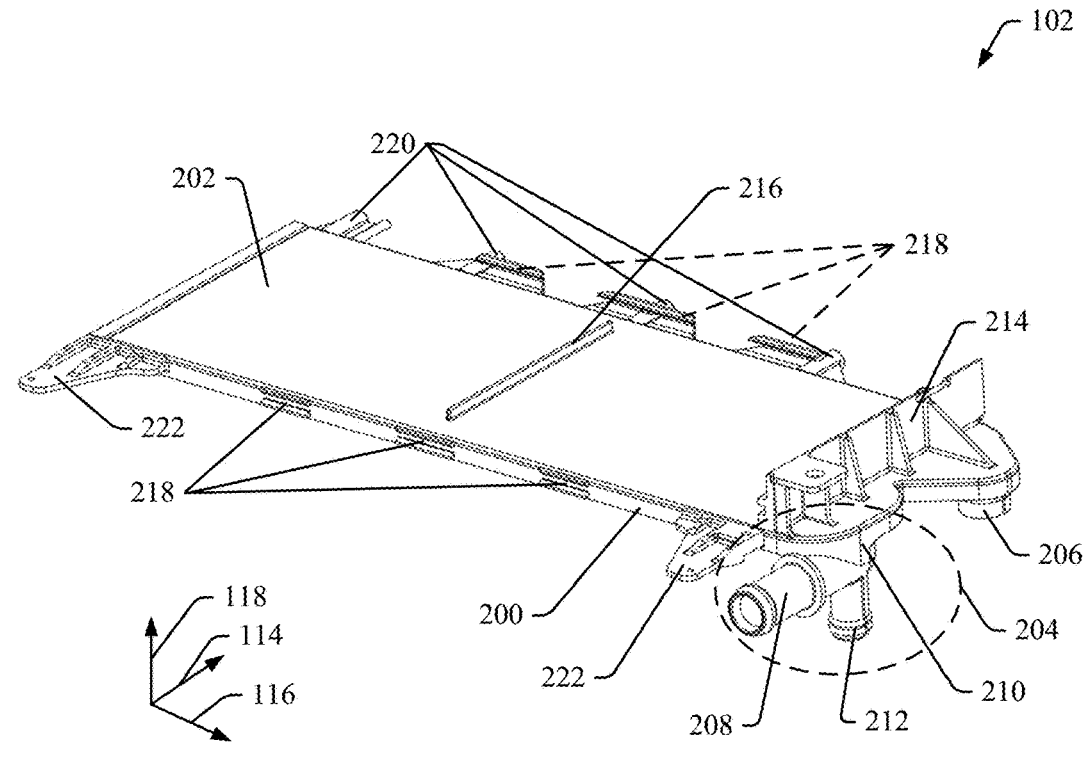
FIGS. 2A and 2B illustrate, in accordance with this disclosure, an example top plate of the heat exchanger of FIG. 1.
Figure 2B:
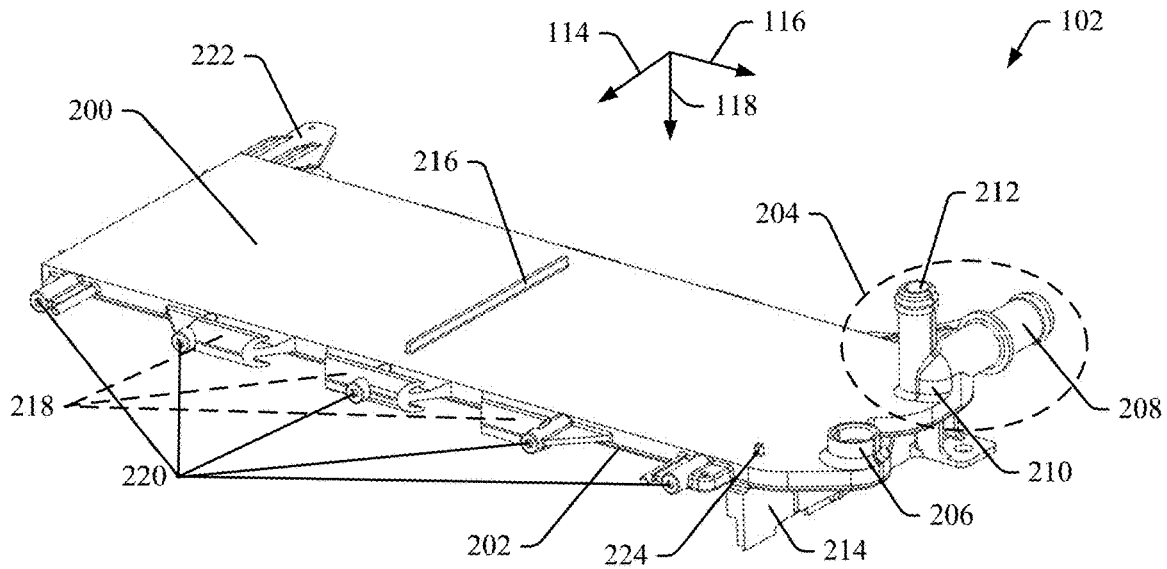

FIGS. 2A and 2B illustrate an example of the top plate 102 of the heat exchanger 100. The top plate 102 includes a top plate body 200 and a top plate cover 202. Together, the top plate body 200 and the top plate cover 202 form a top plate cavity that is discussed further below. The top plate body 200 and the top plate cover 202 may be joined and sealed via any techniques known by those of ordinary skill. For example, the top plate cover 202 may be joined to the top plate body 200 via screws/bolts, alignment pins, interference fits, adhesives, gaskets, O-rings, welding/brazing, or any combination thereof.

The top plate 102 includes a top plate manifold 204 and a top plate port 206. As discussed below, the top plate manifold 204 and the top plate port 206 may be part of the top plate body 200 (e.g., formed as a single structure/component).

The top plate manifold 204 includes a top plate heat exchanger port 208 (e.g., hose connection) configured to bring the heat transfer fluid into or out of the heat exchanger 100. The top plate manifold 204 also includes a top plate cavity port 210 and a top plate transfer port 212. The top plate cavity port 210 is configured to provide the heat transfer fluid into or out of the top plate cavity. The top plate transfer port 212 is configured to provide the heat transfer fluid into or out of the bottom plate 104. The top plate transfer port 212 is configured to mate and seal with a corresponding bottom plate port (e.g., via one or more O-rings, sealant, adhesive, gasket, weld/braze joint, etc., or some combination thereof).

As illustrated, the top plate heat exchanger port 208 extends along the insertion axis 114 (e.g., towards the front of the heat exchanger 100). However, the top plate heat exchanger port 208 may extend along any direction. The top plate transfer port 212 extends along the stack axis 118 (e.g., towards the bottom of the heat exchanger 100). A length of the extension may correspond to the offset between the top plate 102 and the bottom plate 104.

The top plate port 206 is configured to mate with a bottom plate transfer port and provide the heat transfer fluid into or out of the top plate 102. The top plate port 206 is configured to be a complimentary shape/profile to the bottom plate transfer port.

The top plate cover 202 may include one or more top plate supporting structures 214. The top plate supporting structures 214 are configured to support the top plate manifold 204, the top plate port 206, and connections including them. The top plate supporting structures 214 may include any number of supporting walls and/or gussets to provide the support.

The top plate 102 may include one or more top plate guides 216 configured to guide and secure the electrical components along the horizontal axis 116. The top plate guides 216 may be fins or rails configured to keep the electrical components from moving left or right in the heat exchanger 100 during insertion and once inserted.

The top plate 102 may include one or more top plate alignment features 218. The top plate alignment features 218 are configured to guide and secure the electrical components along the stack axis 118. Furthermore, the top plate alignment features 218 may ensure that the heat generating surfaces of the electrical components are in contact with the top plate 102. In order to do so, the top plate alignment features 218 may include various hooks and/or chamfers to drive the electrical components to respective surfaces of the top plate 102.

The top plate alignment features 218 may be disposed on front and/or rear surfaces of the top plate 102 to align respective sides of the electrical components on insertion. Because the top plate 102 is configured to absorb heat from electrical components on a top side and a bottom side, the top plate alignment features 218 may be on a top and bottom of front and/or rear surfaces of the top plate 102. Any number or configuration of the top plate alignment features 218 may be used without departing from the scope of this disclosure.

The top plate 102 may include one or more top plate electrical board attachment features 220 to allow for a securing of an electrical board to the heat exchanger 100. The electrical board may contain corresponding connectors to those of the electrical components. The top plate electrical board attachment features 220 may be threaded holes (e.g., within protruding posts). Any number or configuration of the top plate electrical board attachment features 220 may be used without departing from the scope of this disclosure.

The top plate 102 may include one or more top plate locking mechanism supports 222. The top plate locking mechanism supports 222 are configured to support one or more of the locking mechanisms 110. In some embodiments, the right frame 106 and the left frame 108 may contain locking mechanism supports (instead of or in addition to top plate 102).

The top plate 102 may include one or more top plate frame alignment features 224. The top plate frame alignment features 224 are configured to align the right frame 106 and/or the left frame 108 during assembly. The top plate frame alignment features 224 may be columns/cylinders, protrusions, cavities, rails, slots, holes, guides, etc., or any combination thereof. Furthermore, the top plate 102 may include various top plate frame securing features (not shown) configured to facilitate fastening of the right frame 106 and the left frame 108 to the top plate 102. For example, the top plate frame securing features may include thru holes, threaded holes, press-fit structures, etc., or some combination thereof.

Various features may be part of the top plate body 200 and the top plate cover 202. For example, the top plate body 200 may include the top plate manifold 204, the top plate port 206, one or more of the top plate guides 216, the top plate alignment features 218, the top plate electrical board attachment features 220, and the top plate locking mechanism supports 222. The top plate cover 202 may include the top plate supporting structures 214 and one or more of the top plate guides 216. Any number of the features may be switched between the two parts without departing from the scope of this disclosure.

Regardless of which components have which features, the top plate body 200 and the top plate cover 202 are formed as single pieces. The top plate body 200 and the top plate cover 202 may be formed of metal (e.g., aluminum, magnesium, iron, etc., or alloys thereof) due to its high heat conductivity. For example, the top plate body 200 and the top plate cover 202 may be cast components (e.g., die-cast, sand cast, shell mold cast, investment cast, permanent mold cast, plaster mold cast, etc.).

In some embodiments, the top plate 102 may be formed as a single piece (instead of two). For example, the top plate 102 may be sintered, 3D printed, centrifugally cast, etc.

It should also be apparent that some of the features of the top plate 102 may require secondary operations (e.g., machining) to perform their intended purpose. For example, the top plate port 206 may require a machine bored hole to ensure that O-rings of the bottom plate transfer port seal thereto.

Figure 3A:
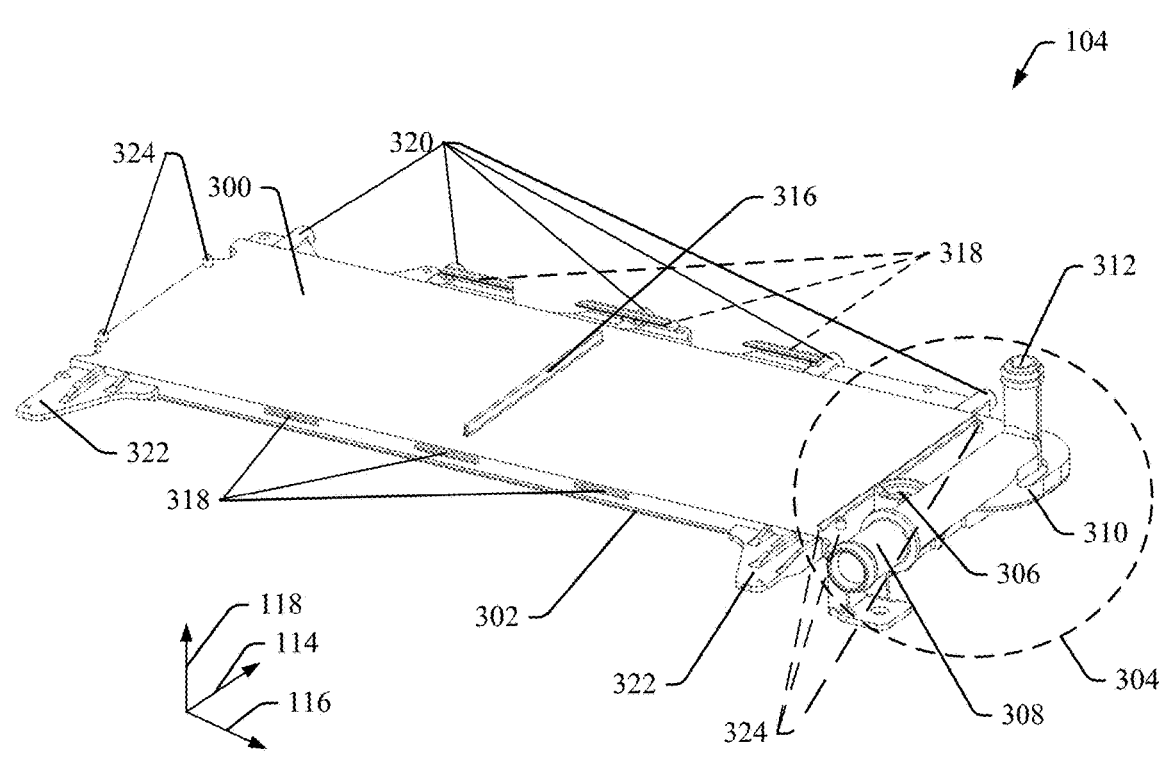
FIGS. 3A and 3B illustrate, in accordance with this disclosure, an example bottom plate of the heat exchanger of FIG. 1.
Figure 3B:
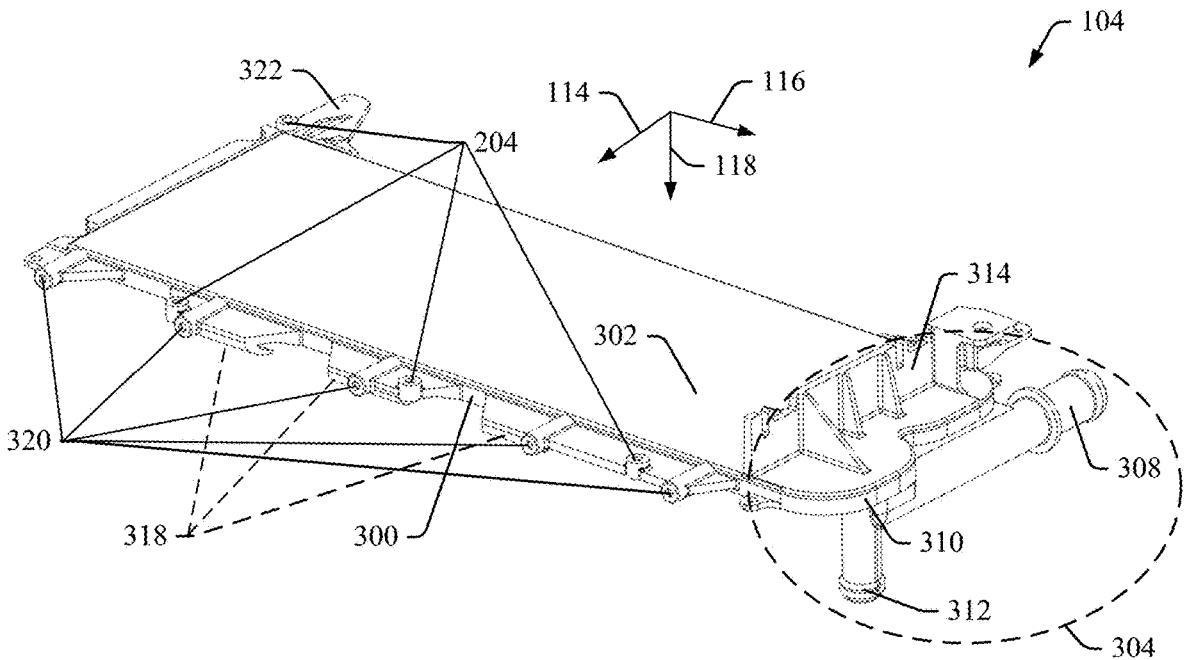

FIGS. 3A and 3B illustrate an example of the bottom plate 104 of the heat exchanger 100. The bottom plate 104 includes a bottom plate body 300 and a bottom plate cover 302. Together, the bottom plate body 300 and the bottom plate cover 302 form a bottom plate cavity that is discussed further below. The bottom plate body 300 and the bottom plate cover 302 may be joined and sealed via any techniques known by those of ordinary skill. For example, the bottom plate cover 302 may be joined with the bottom plate body 300 via screws/bolts, alignment pins, interference fits, adhesives, gaskets, O-rings, welding/brazing, etc., or any combination thereof.

The bottom plate 104 includes a bottom plate manifold 304 and a bottom plate port 306. As discussed below, the bottom plate manifold 304 and the bottom plate port 306 may be part of the bottom plate body 300 (e.g., formed as a single structure/component).

The bottom plate manifold 304 includes a bottom plate heat exchanger port 308 (e.g., hose connection) configured to bring the heat transfer fluid into or out of the heat exchanger 100. The bottom plate manifold 304 also includes a bottom plate cavity port 310 and a bottom plate transfer port 312. The bottom plate cavity port 310 is configured to provide the heat transfer fluid into or out of the bottom plate cavity. The bottom plate transfer port 312 is configured to provide the heat transfer fluid into or out of the top plate 102. The bottom plate transfer port 312 is configured to mate and seal with the top plate port 206 (e.g., via one or more O-rings, sealant, adhesive, gasket, weld/braze joint, etc., or some combination thereof).

As illustrated, the bottom plate heat exchanger port 308 extends along the insertion axis 114 (e.g., towards the front of the heat exchanger 100). However, the bottom plate heat exchanger port 308 may extend along any direction. The bottom plate transfer port 312 extends along the stack axis 118 (e.g., towards the bottom of the heat exchanger 100). A length of the extension may correspond to the offset between the top plate 102 and the bottom plate 104.

The bottom plate port 306 is configured to mate with the top plate transfer port 212 and provide the heat transfer fluid into or out of the bottom plate 104. The bottom plate port 306 is configured to be a complimentary shape/profile to the top plate transfer port 212.

The bottom plate cover 302 may include one or more bottom plate supporting structures 314. The bottom plate supporting structures 314 are configured to support the bottom plate manifold 304, the bottom plate port 306, and connections including them. The bottom plate supporting structures 314 may include any number of supporting walls and/or gussets to provide the support.

The bottom plate 104 may include one or more bottom plate guides 316 configured to guide and secure the electrical components along the horizontal axis 116. The bottom plate guides 316 may be fins or rails configured to keep the electrical components from moving left or right in the heat exchanger 100 during insertion and once inserted.

The bottom plate 104 may include one or more bottom plate alignment features 318. The bottom plate alignment features 318 are configured to guide and secure the electrical components along the stack axis 118. Furthermore, the bottom plate alignment features 318 may ensure that the heat generating surfaces of the electrical components are in contact with the bottom plate 104. In order to do so, the bottom plate alignment features 318 may include various hooks and/or chamfers to drive the electrical components to respective surfaces of the bottom plate 104.

The bottom plate alignment features 318 may be disposed on front and/or rear surfaces of the bottom plate 104 to align respective sides of the electrical components on insertion. Because the bottom plate 104 is configured to absorb heat from an electrical component on a top side of the bottom plate 104, the bottom plate alignment features 318 may be on a top side of the front and/or rear surfaces of the bottom plate 104. Any number or configuration of the bottom plate alignment features 318 may be used without departing from the scope of this disclosure.

The bottom plate 104 may include one or more bottom plate electrical board attachment features 320 to allow for the securing of the electrical board to the heat exchanger 100. The bottom plate electrical board attachment features 320 may be threaded holes (e.g., within protruding posts). Any number or configuration of the bottom plate electrical board attachment features 320 may be used without departing from the scope of this disclosure.

The bottom plate 104 may include one or more bottom plate locking mechanism supports 322. The bottom plate locking mechanism supports 322 are configured to support one or more of the locking mechanisms 110. In some embodiments, the right frame 106 and the left frame 108 may contain locking mechanism supports (instead of or in addition to the bottom plate 104).

The bottom plate 104 may include one or more bottom plate frame alignment features 324. The bottom plate frame alignment features 324 are configured to align the right frame 106 and/or the left frame 108 during assembly. The bottom plate frame alignment features 324 may be columns/cylinders, protrusions, cavities, rails, slots, holes, guides, etc., or any combination thereof. Furthermore, the bottom plate 104 may include various bottom plate frame securing features (not shown) configured to facilitate fastening of the right frame 106 and the left frame 108 to the bottom plate 104. For example, the bottom plate frame securing features may include thru holes, threaded holes, press-fit structures, etc., or some combination thereof.

Various features may be parts of the bottom plate body 300 and the bottom plate cover 302. For example, the bottom plate body 300 may include the bottom plate manifold 304, the bottom plate port 306, one or more of the bottom plate guides 316, the bottom plate alignment features 318, the bottom plate electrical board attachment features 320, and the bottom plate locking mechanism supports 322. The bottom plate cover 302 may include the bottom plate supporting structures 314 and one or more of the bottom plate guides 316. Any number of the features may be switched between the two parts without departing from the scope of this disclosure.

Regardless of which components have which features, the bottom plate body 300 and the bottom plate cover 302 are formed as single pieces. The bottom plate body 300 and the bottom plate cover 302 may be formed of metal (e.g., aluminum, magnesium, iron, etc., or alloys thereof) due to its high heat conductivity. For example, the bottom plate body 300 and the bottom plate cover 302 may be cast components (e.g., die-cast, sand cast, shell mold cast, investment cast, permanent mold cast, plaster mold cast, etc.).

In some embodiments, the bottom plate 104 may be formed as a single piece (instead of two). For example, the bottom plate 104 may be sintered, 3D printed, centrifugally cast, etc.

It should also be apparent that some of the features of the bottom plate 104 may require secondary operations (e.g., machining) to perform their intended purpose. For example, the bottom plate port 306 may require a machine bored hole to ensure that O-rings of the top plate transfer port 212 seal thereto.

Figure 4A:
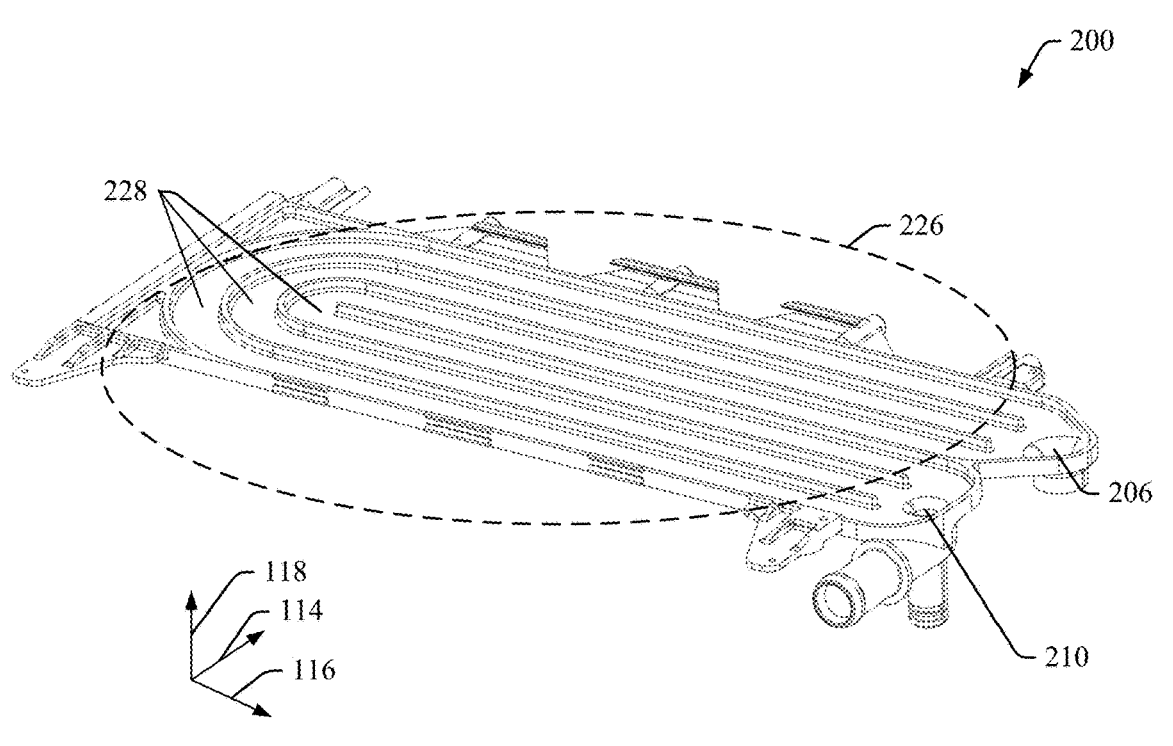
FIGS. 4A and 4B illustrate, in accordance with this disclosure, an example top plate body of the top plate of FIG. 2 and an example bottom plate body of the bottom plate of FIG. 3, respectively.
Figure 4B:
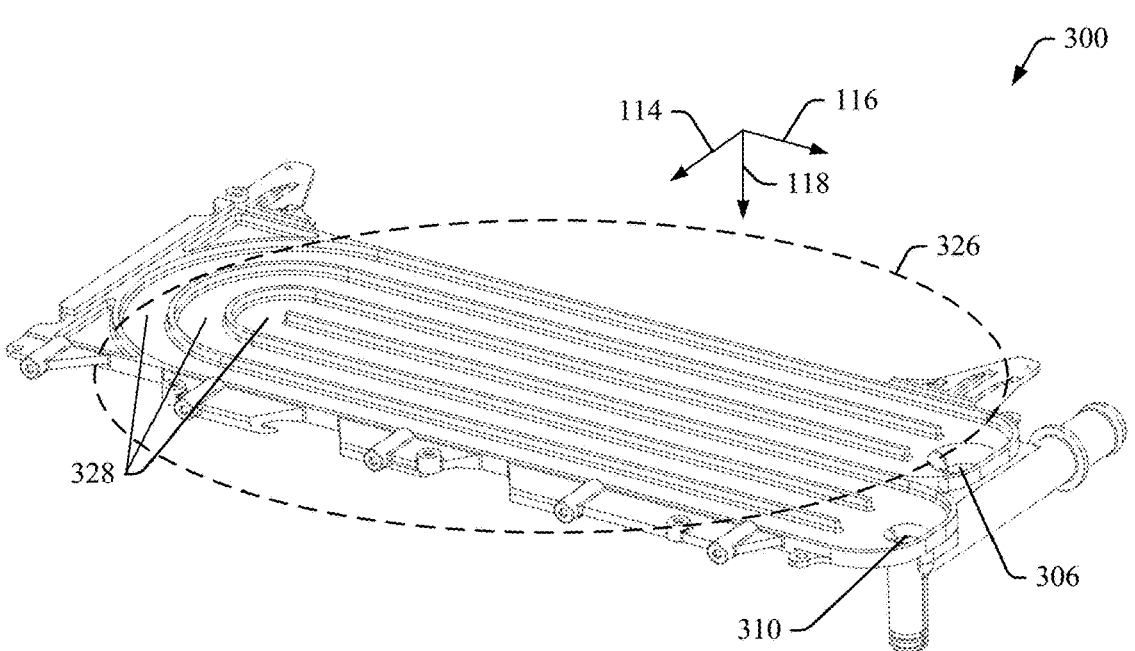

FIGS. 4A and 4B illustrate an example of the top plate body 200 of the top plate 102 and an example of the bottom plate body 300 of the bottom plate 104, respectively. The top plate body 200 includes features that make up the top plate cavity 226. Specifically, the top plate body 200 may include ribs or protrusions that form one or more top plate cavity channels 228. The top plate cavity channels 228 are configured to provide the heat transfer fluid between the top plate port 206 and the top plate cavity port 210. As discussed above, the top plate body 200 may be formed as a single piece (e.g., die-cast) and may contain one or more of the features of the top plate 102 (e.g., the top plate manifold 204, the top plate port 206, one or more top plate guides 216, one or more top plate alignment features 218, one or more top plate electrical board attachment features 220, one or more top plate locking mechanism supports 222, and/or one or more top plate frame alignment features 224).

The bottom plate body 300 includes features that make up the bottom plate cavity 326. Specifically, the bottom plate body 300 may include ribs or protrusions that form one or more bottom plate cavity channels 328. The bottom plate cavity channels 328 are configured to provide the heat transfer fluid between the bottom plate port 306 and the bottom plate cavity port 310. As discussed above, the bottom plate body 300 may be formed as a single piece (e.g., die-cast) and may contain one or more of the features of the bottom plate 104 (e.g., the bottom plate manifold 304, the bottom plate port 306, one or more bottom plate guides 316, one or more bottom plate alignment features 318, one or more bottom plate electrical board attachment features 320, one or more bottom plate locking mechanism supports 322, and/or one or more bottom plate frame alignment features 324).

Figure 5A:
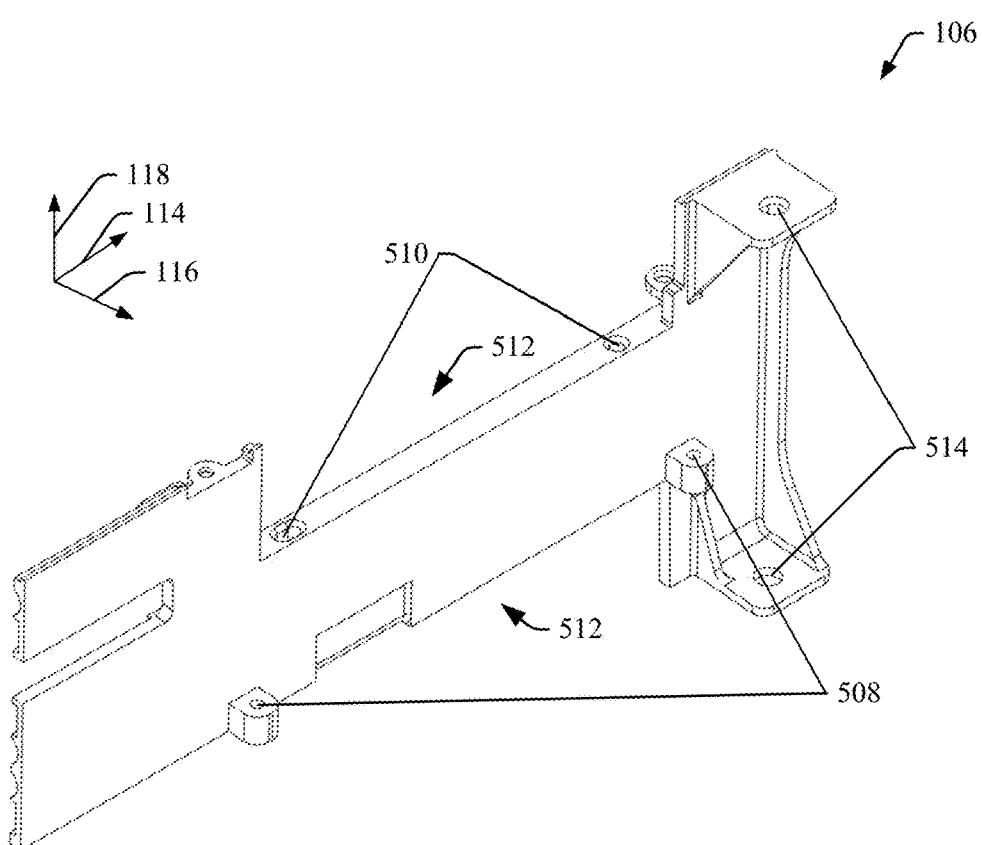
FIGS. 5A and 5B illustrate, in accordance with this disclosure, an example right frame of the heat exchanger of FIG. 1.
Figure 5B:
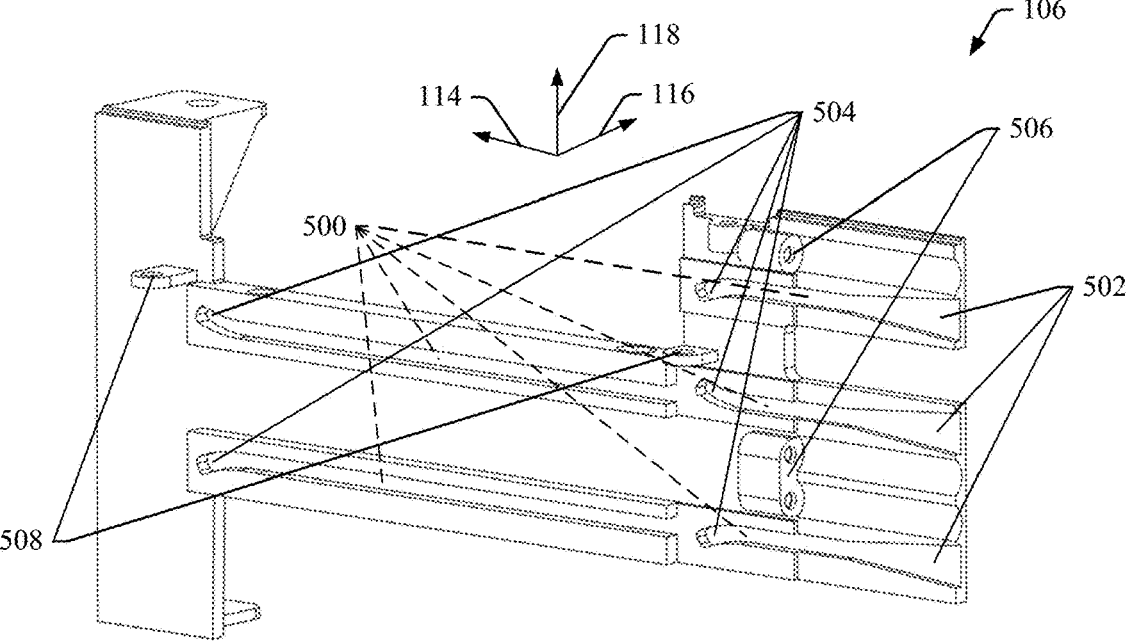

FIGS. 5A and 5B illustrate an example of the right frame 106 of the heat exchanger 100. The right frame 106 includes right frame guides 500. The right frame guides 500 are configured to guide and secure the electrical components on insertion. In the stack axis 118, there are three heights of right frame guides 500 (one for each of three electrical components). If the heat exchanger is configured to accept four electrical components, then there may be four heights. The lower heights (e.g., the bottom two) are configured with sets of right frame guides 500 (e.g., one in the front and one in the rear). The sets allow for front and rear positioning of the electrical components.

The top stack height includes a single right frame guide 500. This is because the rear guide is part of the top plate cover 202 (e.g., on a left side of the top plate supporting structures 214). In some implementations, the supporting structures may be part of the right frame 106. In such cases, the top height may be configured with a set of right frame guides 500.

The right frame guides 500 that are towards the front of the heat exchanger 100 include right frame lead-in portions 502. The right frame lead-in portions 502 allow for easy insertion of the electrical components. The right frame guides 500 also include right frame compression portions 504. The right frame compression portions 504 are configured to translate the electrical components along the stack axis 118 toward respective surfaces of the top plate 102 or the bottom plate 104. The translation may occur toward an end of insertion (e.g., near final positions of the electrical components) to avoid damage to the top plate 102, the bottom plate 104, the electrical components, or thermal interface materials (TIM) therebetween. The right frame guides 500 of the respective sets may be offset from each other along the horizontal axis 116 to allow for parallel translation of the electrical components along the stack axis 118.

Although the locking mechanisms 110 are configured to secure the electrical components in the heat exchanger 100, the right frame 106 may contain right frame auxiliary locking features 506. The right frame auxiliary locking features 506 are configured to allow secondary locking of the electrical components in the heat exchanger 100, especially along the insertion axis 114. The right frame auxiliary locking features 506 may comprise threaded holes.

The right frame 106 may include right frame plate connection features 508. The right frame plate connection features 508 are configured to secure the top plate 102 and/or the bottom plate 104 to the right frame 106. The right frame plate connection features 508 may comprise threaded and/or thru holes depending upon implementation.

The right frame 106 may include right frame plate alignment features 510. The right frame plate connection features 508 are configured to align the top plate 102 and/or the bottom plate 104 to the right frame 106 prior to securing the two components via the right frame plate connection features 508. The right frame plate alignment features 510 may comprise posts, pins, slots, holes, etc., or any combination thereof.

The right frame 106 may include right frame cut-outs 512. The right frame cut-outs 512 are configured to allow for the top plate 102, the top plate supporting structures 214, the bottom plate 104, and the bottom plate supporting structures 314. In some implementations, the supporting structures may be part of the right frame 106. In such cases, the right frame cut-outs 512 may be configured differently.

The right frame 106 may include right frame mounting portions 514. The right frame mounting portions 514 are configured to mount the heat exchanger 100 to vehicles in which they are implemented. For example, the right frame mounting portions 514 may comprise threaded and/or thru holes depending upon implementation.

Figure 6A:
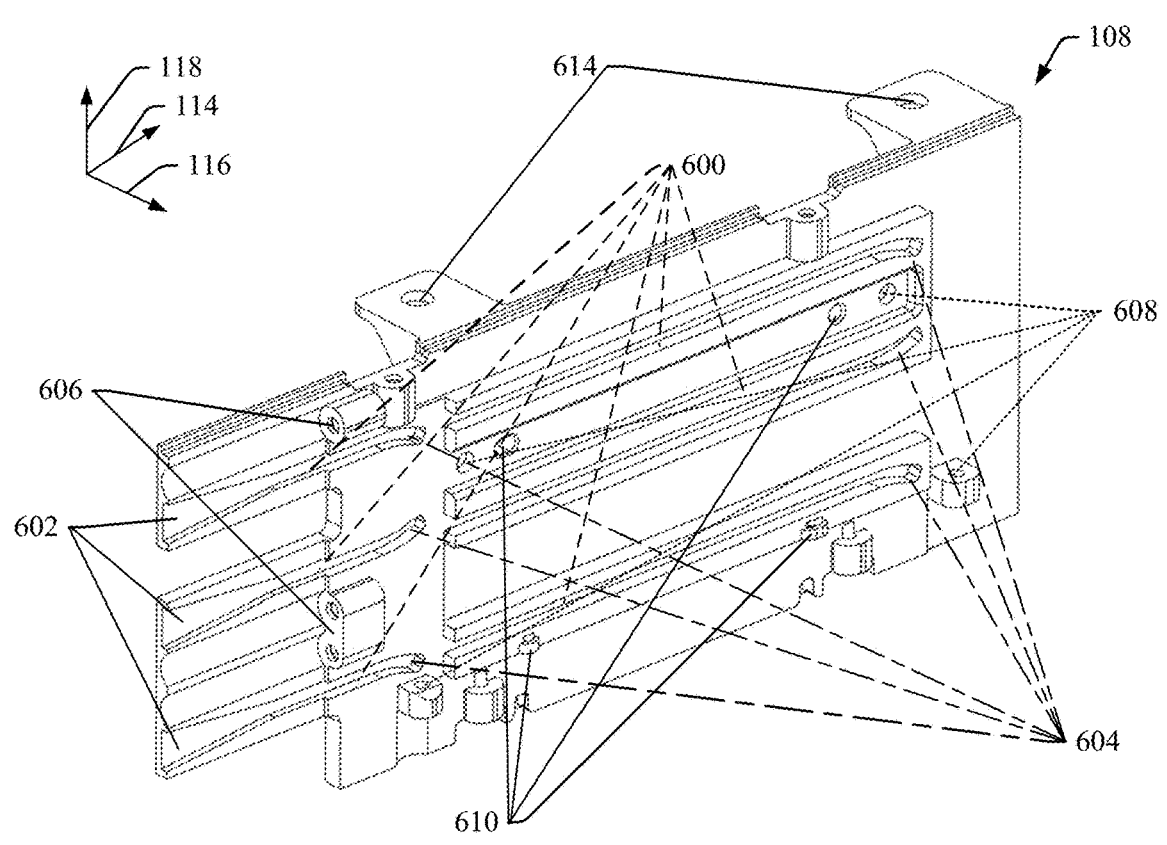
FIGS. 6A and 6B illustrate, in accordance with this disclosure, an example left frame of the heat exchanger of FIG. 1.
Figure 6B:
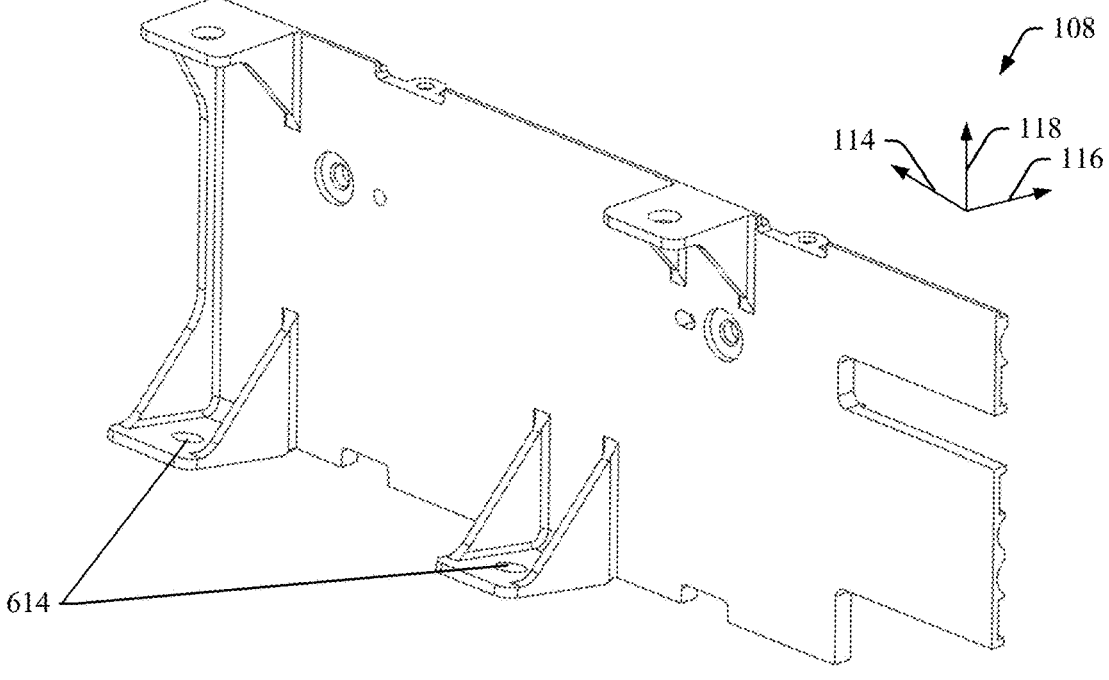

FIGS. 6A and 6B illustrate an example of the left frame 108 of the heat exchanger 100. The left frame 108 includes left frame guides 600. The left frame guides 600 are configured to guide and secure the electrical components on insertion. In the stack axis 118, there are three heights of left frame guides 600 (one for each of three electrical components). If the heat exchanger is configured to accept four electrical components, then there may be four heights. The heights are configured with sets of left frame guides 600 (e.g., one in the front and one in the rear). The sets allow for front and rear positioning of the electrical components.

The left frame guides 600 that are towards the front of the heat exchanger 100 include left frame lead-in portions 602. The left frame lead-in portions 602 allow for easy insertion of the electrical components. The left frame guides 600 also include left frame compression portions 604. The left frame compression portions 604 are configured to translate the electrical components along the stack axis 118 toward respective surfaces of the top plate 102 or the bottom plate 104. The translation may occur toward an end of insertion (e.g., near final positions of the electrical components) to avoid damage to the top plate 102, the bottom plate 104, the electrical components, or thermal interface materials (TIM) therebetween. The left frame guides 600 of the respective sets may be offset from each other along the horizontal axis 116 to allow for parallel translation of the electrical components along the stack axis 118.

Although the locking mechanisms 110 are configured to secure the electrical components in the heat exchanger 100, the left frame 108 may contain left frame auxiliary locking features 606. The left frame auxiliary locking features 606 are configured to allow secondary locking of the electrical components in the heat exchanger 100, especially along the insertion axis 114. The left frame auxiliary locking features 606 may be threaded holes.

The left frame 108 may include left frame plate connection features 608. The left frame plate connection features 608 are configured to secure the top plate 102 and/or the bottom plate 104 to the left frame 108. The left frame plate connection features 608 may comprise threaded and/or thru holes depending upon implementation.

The left frame 108 may include left frame plate alignment features 610. The left frame plate connection features 608 are configured to align the top plate 102 and/or the bottom plate 104 to the left frame 108 prior to securing the two components via the left frame plate connection features 608. The left frame plate alignment features 610 may comprise posts, pins, slots, holes, etc., or any combination thereof.

The left frame 108 may include left frame mounting portions 614. The left frame mounting portions 614 are configured to mount the heat exchanger 100 to vehicles in which they are implemented. For example, the left frame mounting portions 614 may comprise threaded and/or thru holes depending upon implementation.

It should be apparent that, depending upon implementation, features and/or configuration of features of the right frame 106 and the left frame 108 may change. For example, if the top plate manifold 204 and the bottom plate manifold 304 (and associated ports) are on the left side of the heat exchanger 100, then the left frame 108 may look more like the right frame 106 in the illustrated example. If the top plate manifold 204 and the bottom plate manifold 304 are on opposite sides of the heat exchanger 100, then the left frame

108 and the right frame 106 may look similar. Those of ordinary skill should appreciate that the locations of the components and connections can be anywhere around the heat exchanger 100 without departing from the scope of this disclosure.

Figure 7:
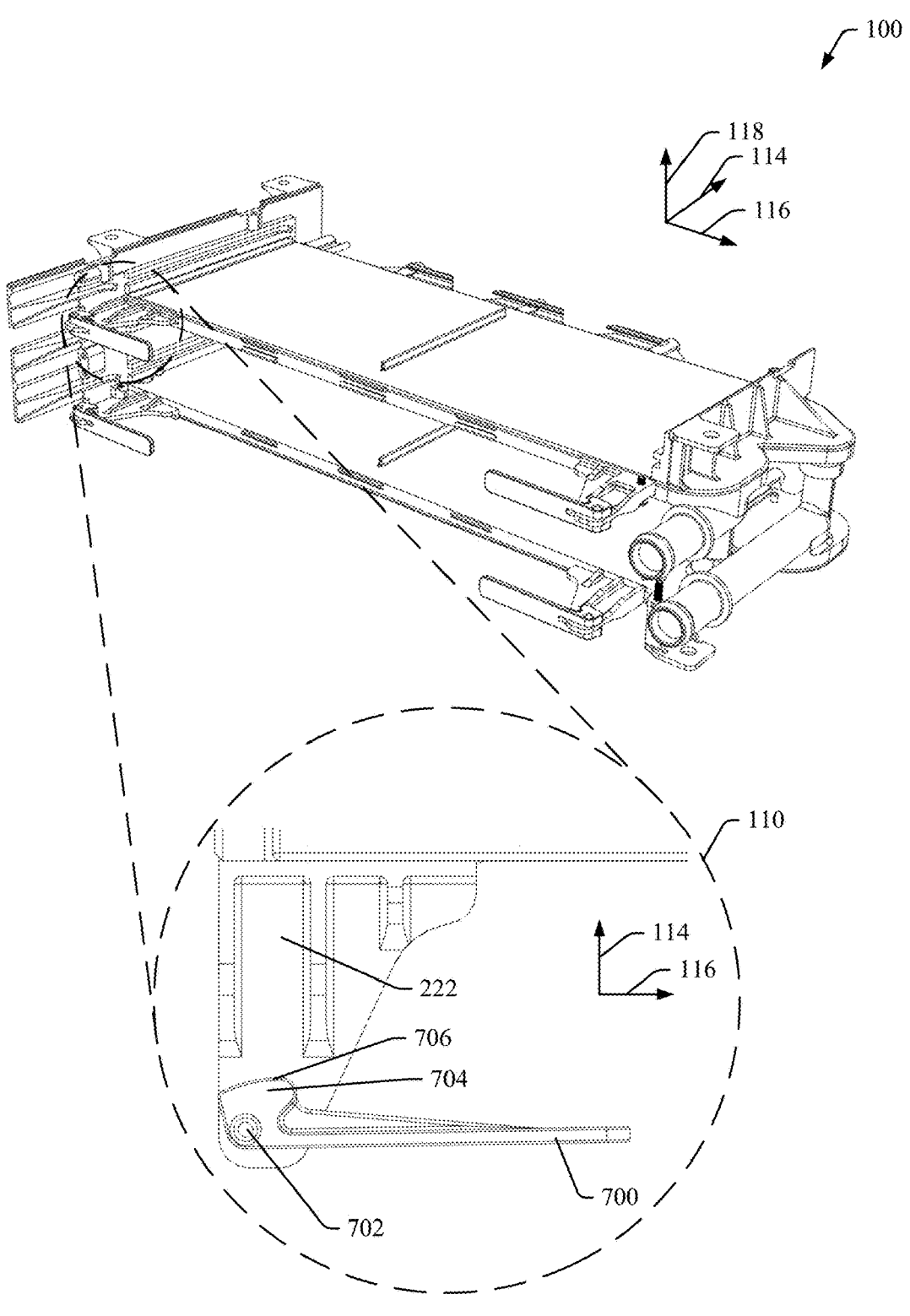
FIG. 7 illustrates, in accordance with this disclosure, an example locking mechanism of the heat exchanger of FIG. 1.

FIG. 7 illustrates an example of one of the locking mechanisms 110 of the heat exchanger 100. The heat exchanger 100 is illustrated with the right frame 106 hidden to show the locking mechanisms 110. As discussed above, the locking mechanisms 110 are configured to finalize insertion and secure the electrical components within the heat exchanger 100. The insertion may require associated electrical connectors to mate while also ensuring compression between the heat generating surfaces of the electrical components and the respective surfaces of the top plate 102 and the bottom plate 104.

The locking mechanisms 110 may employ levers and cams to provide high insertion forces along the insertion axis 114. For example, each of the locking mechanisms 110 may be mounted to a respective locking mechanism support (e.g., a top plate locking mechanism support 222 or a bottom plate locking mechanism support 322) and contain a lever 700 configured to rotate around a pivot 702. The lever 700 may have a cam profile 704 such that as the lever 700 is rotated about the pivot 702, varying amounts of insertion forces may be exerted by a bearing surface 706 onto the respective electrical component along the insertion axis 114. The locking mechanisms 110 may comprise other shapes/configurations (e.g., toggles, linkages, actuators, etc.). Furthermore, a number of the locking mechanisms 110 may change without departing from the scope of this disclosure. For example, a single locking mechanism 110 may be used for each electrical component, or a single locking mechanism 110 may be used for all of the electrical components.

Figure 8:
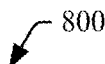
FIG. 8 illustrates, in accordance with this disclosure, an example method of forming and assembling the heat exchanger of FIG. 1.
Figure 8:
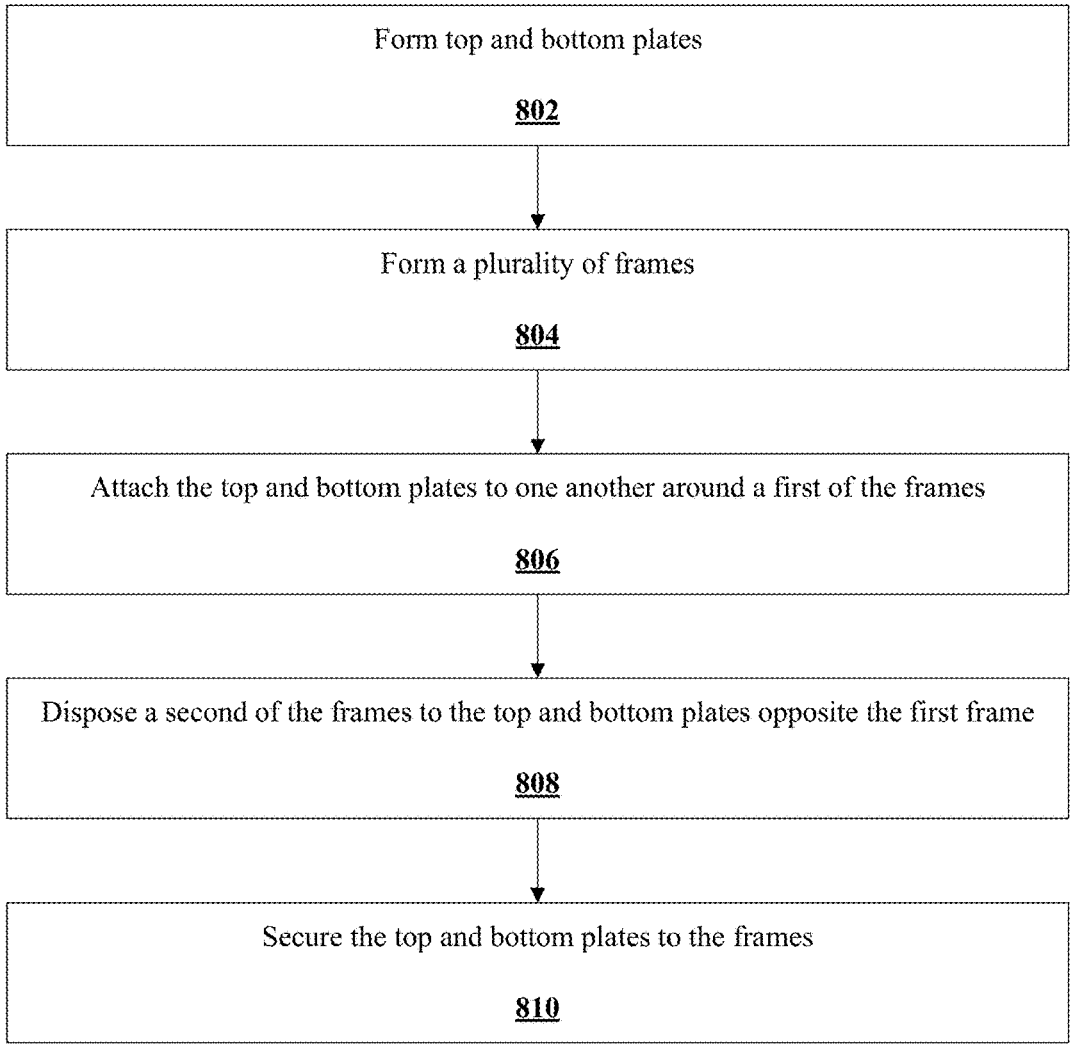

FIG. 8 illustrates an example method 800 of forming and assembling the heat exchanger 100. The order in which the operations are shown and/or described is not intended to be construed as a limitation, and the order may be rearranged without departing from the scope of this disclosure. Furthermore, any number of the operations can be combined with any other number of the operations to implement the example process flow or an alternate process flow.

At step 802, top and bottom plates and formed. For example, the top plate 102 and the bottom plate 104 may be formed. For the top plate 102, the top plate body 200 and the top plate cover 202 may be formed (e.g., cast, forged, sintered) and placed proximate one another along the stack axis 118. A sealing device (e.g., o-ring, gasket) may be added between the top plate body 200 and the top plate cover 202. The top plate cover 202 may be secured to the top plate body 200 (e.g., welded, brazed, screwed, bolted, or clamped) or held loosely thereon. For the bottom plate 104, the bottom plate body 300 and the bottom plate cover 302 may be formed (e.g., cast, forged, sintered) and placed proximate one another along the stack axis 118. A sealing device (e.g., o-ring, gasket) may be added between the bottom plate body 300 and the bottom plate cover 302. The bottom plate cover 302 may be secured to the bottom plate body 300 (e.g., welded, brazed, bolted, or clamped) or held loosely thereon.

At step 804, a plurality of frames are formed. For example, the right frame 106 and the left frame 108 may be formed (e.g., cast, forged, sintered, injection molded, 3D printed) out of metal or plastic.

At step 806, the top and bottom plates are attached to one another around a first of the frames. For example, the top plate 102 and the bottom plate 104 may be attached via their respective manifolds and ports (e.g., each manifold interfaces with the opposite port and visa-versa) around the right frame 106. In some implementations, the top plate 102 and the bottom plate 104 may be attached together prior to disposing the right frame 106.

At step 808, a second of the frames is disposed proximate the top and bottom plates opposite the first frame. For example, the left frame 108 may be disposed proximate ends of the top plate 102 and the bottom plate 104.

At step 810, the top and bottom plates are secured to the frames. For example, the right frame 106 and the left frame 108 may be secured to the right frame 106 and the left frame 108 (e.g., via screws, bolts, clamps, press fits).

It should be noted that the heat exchanger 100 may be assembled in a different order or using different techniques without departing from the scope of this disclosure. The illustrated/described order is simply an example of how the heat exchanger 100 may be formed/assembled.

Example 1: A heat exchanger comprising: a top plate; a bottom plate disposed parallel to the top plate and offset from the top plate along a stack axis; and a plurality of frames connected to respective ends of the top plate and the bottom plate, the frames comprising frame guides configured to guide one or more electrical components as they are inserted along an insertion axis such that each of the electrical components are in contact with a respective surface of either the top plate or the bottom plate once inserted.

Example 2: The heat exchanger of example 1, wherein: the top plate comprises: a top plate manifold configured to: provide a heat transfer fluid out of or into the heat exchanger; provide the heat transfer fluid out of or into a top plate cavity; mate with a bottom plate port of a bottom plate of the heat exchanger; and provide the heat transfer fluid out of or into the bottom plate port; a top plate port configured to: mate with a bottom plate manifold of the heat exchanger; and provide the heat transfer fluid into or out of the top plate cavity; and the bottom plate comprises: the bottom plate manifold configured to: provide the heat transfer fluid into or out of the heat exchanger; provide the heat transfer fluid into or out of a bottom plate cavity; mate with the top plate port; and provide the heat transfer fluid into or out of the top plate port; the bottom plate port configured to: mate with the top plate manifold; and provide the heat transfer fluid out of or into the bottom plate cavity.

Example 3: The heat exchanger of example 2, wherein the top plate manifold and the bottom plate manifold are integrated with the top plate and the bottom plate, respectively.

Example 4: The heat exchanger of example 3, wherein: the top plate further comprises a top plate body and a top plate cover; the top plate body comprises the top plate manifold; the bottom plate further comprises a bottom plate body and a bottom plate cover; and the bottom plate body comprises the bottom plate manifold.

Example 5: The heat exchanger of example 4, wherein: the top plate manifold, the bottom plate port, the top plate port, and the bottom plate manifold are on a same side of the top plate and the bottom plate; and the top plate cover and the bottom plate cover have supporting structures on the same side configured to support the top plate manifold, the bottom plate port, the top plate port, the bottom plate manifold, and connections therebetween.

Example 6: The heat exchanger of example 2, wherein the top plate body and the bottom plate body are casted components.

Example 7: The heat exchanger of example 1, wherein the frames are casted or injection molded components.

Example 8: The heat exchanger of example 1, wherein the frame guides comprise channels configured to guide corresponding features on the electrical components.

Example 9: The heat exchanger of example 8, wherein the channels are curved towards rear ends of the channels such that each of the electrical components are translated in the stack axis toward the respective surfaces.

Example 10: The heat exchanger of example 1, wherein the frame guides are further configured to guide two electrical components between the top plate and the bottom plate.

Example 11: The heat exchanger of example 10, wherein the frame guides are further configured to guide a first of the electrical components to be in contact with the bottom plate and a second of the electrical components to be in contact with the top plate.

Example 12: The heat exchanger of example 11, wherein the frame guides are further configured to guide a third electrical component to be in contact with the top plate.

Example 13: The heat exchanger of example 1, further comprising one or more locking mechanisms configured to secure the electrical components in the heat exchanger upon insertion.

Example 14: The heat exchanger of example 13, wherein the locking mechanisms comprise latches.

Example 15: The heat exchanger of example 13, wherein the locking mechanisms are attached to at least one of the top plate or the bottom plate.

Example 16: The heat exchanger of example 1, wherein: the top plate comprises one or more top plate guides configured to guide and secure one or more of the electrical components in a horizontal axis that is perpendicular to the insertion axis and the stack axis; and the bottom plate comprises one or more bottom plate guides configured to align another of the electrical components in the horizontal axis.

Example 17: The heat exchanger of example 1, wherein: the top plate comprises one or more top plate alignment features disposed on a rear side of the top plate and configured to guide and secure one or more of the electrical components in the stack axis; and the bottom plate comprises one or more bottom plate alignment features disposed on a rear side of the bottom plate and configured to guide and secure one or more of the electrical components in the stack axis.

Example 18: The heat exchanger of example 17, wherein the top plate alignment features and the bottom plate alignment features are configured to guide and secure the electrical components when the electrical components are near final positions of insertion.

Example 19: The heat exchanger of example 1, wherein the top plate and the bottom plate comprise electrical board attachment features on a rear end of the top plate and the bottom plate, the electrical board attachment features configured to secure an electrical board to the top plate and the bottom plate.

Example 20: The heat exchanger of example 2, wherein: the top plate manifold comprises a top plate heat exchanger port configured for the provision of the heat transfer fluid out of or into the heat exchanger; the bottom plate manifold comprises a bottom plate heat exchanger port configured for the provision of the heat transfer fluid into or out of the heat exchanger; and the top plate heat exchanger port and the bottom plate heat exchanger port are located proximate to each other.

While various embodiments of the disclosure are described in the foregoing description and shown in the drawings, it is to be understood that this disclosure is not limited thereto but may be variously embodied to practice within the scope of the following claims. From the foregoing description, it will be apparent that various changes may be made without departing from the spirit and scope of the disclosure as defined by the following claims.

The use of "or" and grammatically related terms indicates non-exclusive alternatives without limitation unless the context clearly dictates otherwise. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

What is claimed is:

1. A heat exchanger comprising:
a top plate;
a bottom plate disposed parallel to the top plate and offset from the top plate along a stack axis; and
a plurality of frames connected to respective ends of the top plate and the bottom plate, the frames comprising frame guides configured to guide one or more electrical components as they are inserted along an insertion axis such that each of the electrical components are in contact with a respective surface of either the top plate or the bottom plate once inserted, wherein:
the top plate includes:
a top plate manifold configured to:
provide a heat transfer fluid out of or into the heat exchanger;
provide the heat transfer fluid out of or into a top plate cavity;
mate with a bottom plate port of the bottom plate of the heat exchanger; and
provide the heat transfer fluid out of or into the bottom plate port;
a top plate port configured to:
mate directly with a bottom plate manifold of the heat exchanger; and
provide the heat transfer fluid into or out of the top plate cavity; and the bottom plate includes:
the bottom plate manifold configured to:
provide the heat transfer fluid into or out of the heat exchanger;
provide the heat transfer fluid into or out of a bottom plate cavity;
mate with the top plate port; and provide the heat transfer fluid into or out of the top plate port;
the bottom plate port configured to:
mate directly with the top plate manifold; and
provide the heat transfer fluid out of or into the bottom plate cavity.

2. The heat exchanger of claim 1, wherein the top plate manifold and the bottom plate manifold are integrated with the top plate and the bottom plate, respectively.

3. The heat exchanger of claim 2, wherein:
the top plate further comprises a top plate body and a top plate cover;
the top plate body comprises the top plate manifold;

the bottom plate further comprises a bottom plate body and a bottom plate cover; and the bottom plate body comprises the bottom plate manifold.

4. The heat exchanger of claim 3, wherein:

the top plate manifold, the bottom plate port, the top plate port, and the bottom plate manifold are on a same side of the top plate and the bottom plate; and the top plate cover and the bottom plate cover have supporting structures on the same side configured to support the top plate manifold, the bottom plate port, the top plate port, the bottom plate manifold, and connections therebetween.

5. The heat exchanger of claim 3, wherein the top plate body and the bottom plate body are casted components.

6. The heat exchanger of claim 1, wherein the frames are casted or injection molded components.

7. The heat exchanger of claim 1, wherein the frame guides comprise channels configured to guide corresponding features on the electrical components.

8. The heat exchanger of claim 7, wherein the channels are curved towards rear ends of the channels such that each of the electrical components are translated in the stack axis toward the respective surfaces.

9. The heat exchanger of claim 1, wherein the frame guides are further configured to guide two electrical components between the top plate and the bottom plate.

10. The heat exchanger of claim 9, wherein the frame guides are further configured to guide a first of the electrical components to be in contact with the bottom plate and a second of the electrical components to be in contact with the top plate.

11. The heat exchanger of claim 10, wherein the frame guides are further configured to guide a third electrical component to be in contact with the top plate.

12. The heat exchanger of claim 1, further comprising one or more locking mechanisms configured to secure the electrical components in the heat exchanger upon insertion.

13. The heat exchanger of claim 12, wherein the locking mechanisms comprise latches.

14. The heat exchanger of claim 12, wherein the locking mechanisms are attached to at least one of the top plate or the bottom plate.

15. The heat exchanger of claim 1, wherein:

the top plate comprises one or more top plate guides configured to guide and secure one or more of the electrical components in a horizontal axis that is perpendicular to the insertion axis and the stack axis; and the bottom plate comprises one or more bottom plate guides configured to align another of the electrical components in the horizontal axis.

16. The heat exchanger of claim 1, wherein:

the top plate comprises one or more top plate alignment features disposed on a rear side of the top plate and configured to guide and secure one or more of the electrical components in the stack axis; and the bottom plate comprises one or more bottom plate alignment features disposed on a rear side of the bottom plate and configured to guide and secure one or more of the electrical components in the stack axis.

17. The heat exchanger of claim 16, wherein the top plate alignment features and the bottom plate alignment features are configured to guide and secure the electrical components when the electrical components are near final positions of insertion.

18. The heat exchanger of claim 1, wherein the top plate and the bottom plate comprise electrical board attachment features on a rear end of the top plate and the bottom plate, the electrical board attachment features configured to secure an electrical board to the top plate and the bottom plate.

19. The heat exchanger of claim 1, wherein:

the top plate manifold comprises a top plate heat exchanger port configured for the provision of the heat transfer fluid out of or into the heat exchanger;

the bottom plate manifold comprises a bottom plate heat exchanger port configured for the provision of the heat transfer fluid into or out of the heat exchanger; and the top plate heat exchanger port and the bottom plate heat exchanger port are located proximate to each other.

* * * * *